United States Patent
Matsumoto

(10) Patent No.: US 11,425,849 B2
(45) Date of Patent: Aug. 23, 2022

(54) COMPONENT SUPPLY SYSTEM

(71) Applicant: FUJI CORPORATION, Chiryu (JP)

(72) Inventor: Toru Matsumoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 213 days.

(21) Appl. No.: 16/340,187

(22) PCT Filed: Nov. 2, 2016

(86) PCT No.: PCT/JP2016/082574
§ 371 (c)(1),
(2) Date: Apr. 8, 2019

(87) PCT Pub. No.: WO2018/083752
PCT Pub. Date: May 11, 2018

(65) Prior Publication Data
US 2019/0313555 A1    Oct. 10, 2019

(51) Int. Cl.
*H05K 13/02* (2006.01)
*H05K 13/08* (2006.01)
(Continued)

(52) U.S. Cl.
CPC .......... *H05K 13/021* (2013.01); *B23P 19/001* (2013.01); *B65G 47/00* (2013.01);
(Continued)

(58) Field of Classification Search
CPC .... H05K 13/02; H05K 13/021; H05K 13/022; H05K 13/0813; B65G 47/00
See application file for complete search history.

(56) References Cited

U.S. PATENT DOCUMENTS 2,977,027 A * 3/1961 Alden .................... H05K 13/02
                                                     222/156
4,187,051 A * 2/1980 Kirsch ..................... B25J 9/041
                                                    414/744.3
(Continued)

FOREIGN PATENT DOCUMENTS

JP           6-6075 A     1/1994
JP      2004-281717 A    10/2004
(Continued)

OTHER PUBLICATIONS

International Search Report dated Feb. 7, 2017 in PCT/JP2016/082574 filed Nov. 2, 2016.

*Primary Examiner* — Livius R. Cazan
*Assistant Examiner* — Jeffrey T Carley
(74) *Attorney, Agent, or Firm* — Oblon, McClelland, Maier & Neustadt, L.L.P.

(57) ABSTRACT

A loose component supply device including a stage configured to support scattered components; a holding tool configured to hold a component scattered on the stage; and a component reception member in which is formed a component reception recess in accordance with the component, the device supplying components in a state with the component held by the holding tool loaded in the component reception recess of the component reception member. With the loose component supply device, a setting section is provided for setting any of multiple of the component reception members. An identification plate is provided on the component reception member and a 2D code for identifying the type of the component that is able to be loaded in the component reception recess is provided on the identification plate.

8 Claims, 13 Drawing Sheets

(51) Int. Cl.
  *B23P 19/00* (2006.01)
  *H05K 13/04* (2006.01)
  *B65G 47/00* (2006.01)

(52) U.S. Cl.
  CPC .......... *H05K 13/02* (2013.01); *H05K 13/022* (2013.01); *H05K 13/0409* (2018.08); *H05K 13/0417* (2013.01); *H05K 13/0813* (2018.08)

(56) References Cited

U.S. PATENT DOCUMENTS

| | | | | |
|---|---|---|---|---|
| 5,371,375 | A * | 12/1994 | Stern | H05K 13/0813 356/601 |
| 6,606,788 | B1 * | 8/2003 | Morimoto | H05K 13/0813 29/832 |
| 2003/0000959 | A1 * | 1/2003 | Desai | H05K 13/021 221/282 |
| 2016/0330880 | A1 | 11/2016 | Morikawa | |
| 2017/0057026 | A1 * | 3/2017 | Shen | B65G 37/02 |
| 2017/0196131 | A1 | 7/2017 | Ishikawa | |
| 2017/0238448 | A1 * | 8/2017 | Iwaki | B23P 19/00 700/223 |
| 2018/0249606 | A1 | 8/2018 | Ishikawa et al. | |

FOREIGN PATENT DOCUMENTS

| | | | | |
|---|---|---|---|---|
| JP | 2006-108138 A | 4/2006 | | |
| JP | WO 2015/097904 A1 | 7/2015 | | |
| JP | WO 2015/186188 A1 | 12/2015 | | |
| JP | WO 2016/046897 A1 | 3/2016 | | |
| JP | WO 2016/135909 A1 | 9/2016 | | |
| WO | WO-2004016532 A2 * | 2/2004 | ........... | H01G 13/006 |
| WO | WO-2015097904 A1 * | 7/2015 | ........... | B23P 19/001 |
| WO | WO-2016147331 A1 * | 9/2016 | ........... | H05K 13/028 |

* cited by examiner

COMPONENT SUPPLY SYSTEM

TECHNICAL FIELD

The present application relates to a component supply system configured supply components by holding a component scattered on a stage using a holding tool and loading the component held by the holding tool in a recess on a loading platform.

BACKGROUND ART

Among component supply systems, there are systems that are provided with a stage on which components are scattered, a holding tool for holding a component scattered on the stage, and a loading platform in which a recess with a shape in accordance with the component is formed, wherein the system supplies a component held by the holding tool in a state loaded in the recess of the loading platform. An example of such a component supply system is disclosed in the patent literature below.
Patent literature 1: WO2015/097904

BRIEF SUMMARY

Technical Problem

In the component supply system disclosed in the above patent literature, a setting section for setting any of multiple loading platforms is provided, and a loading platform in accordance with the component scheduled to be supplied is set on the setting section. With such a system, it is necessary to reliably set the loading platform in accordance with the component scheduled to be supplied on the setting section. The present disclosure takes account of the above circumstances and an object thereof is to reliably set a loading platform on the setting section in accordance with the component scheduled to be supplied.

Solution to Problem

To solve the above problem, disclosed herein is a component supply system including: a stage configured to support scattered components; a holding tool configured to hold a component scattered on the stage; and a setting section configured to hold any of multiple loading platforms in which is formed a recess in accordance with the component; wherein the component held by the holding tool is supplied by being loaded in the recess of the loading platform set on the setting section, and the loading platform includes an identification section identifying a type of component that is able to be loaded in the recess.

Advantageous Effects

According to the present disclosure, it is possible to reliably set a loading platform on a setting section in accordance with a component scheduled to be supplied.

DESCRIPTION OF PREFERRED EMBODIMENTS

The following describes in detail referring to the figures an example embodiment of the present disclosure.

Configuration of Component Mounter

Figure 1:
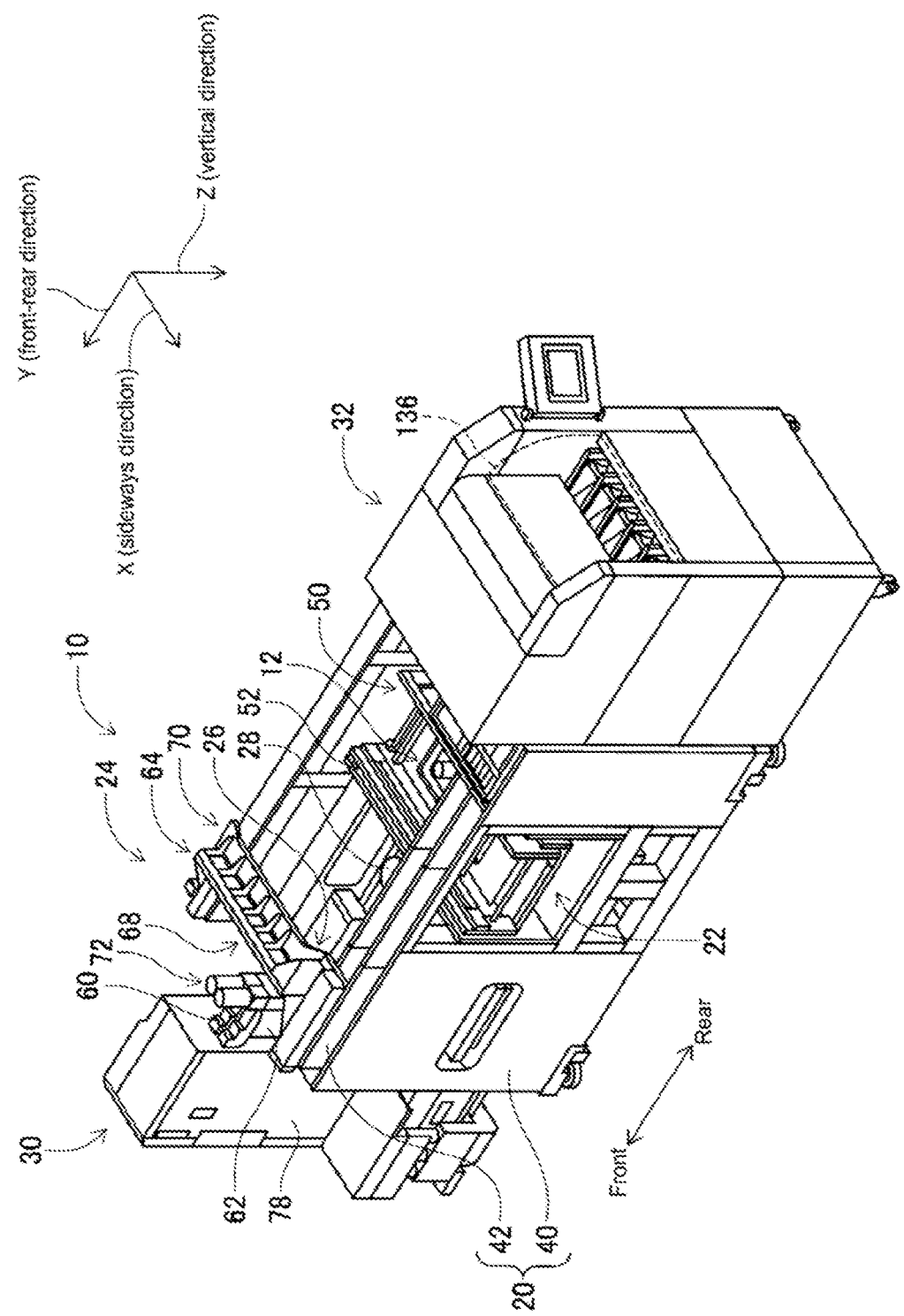
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device 34 (refer to FIG. 11). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
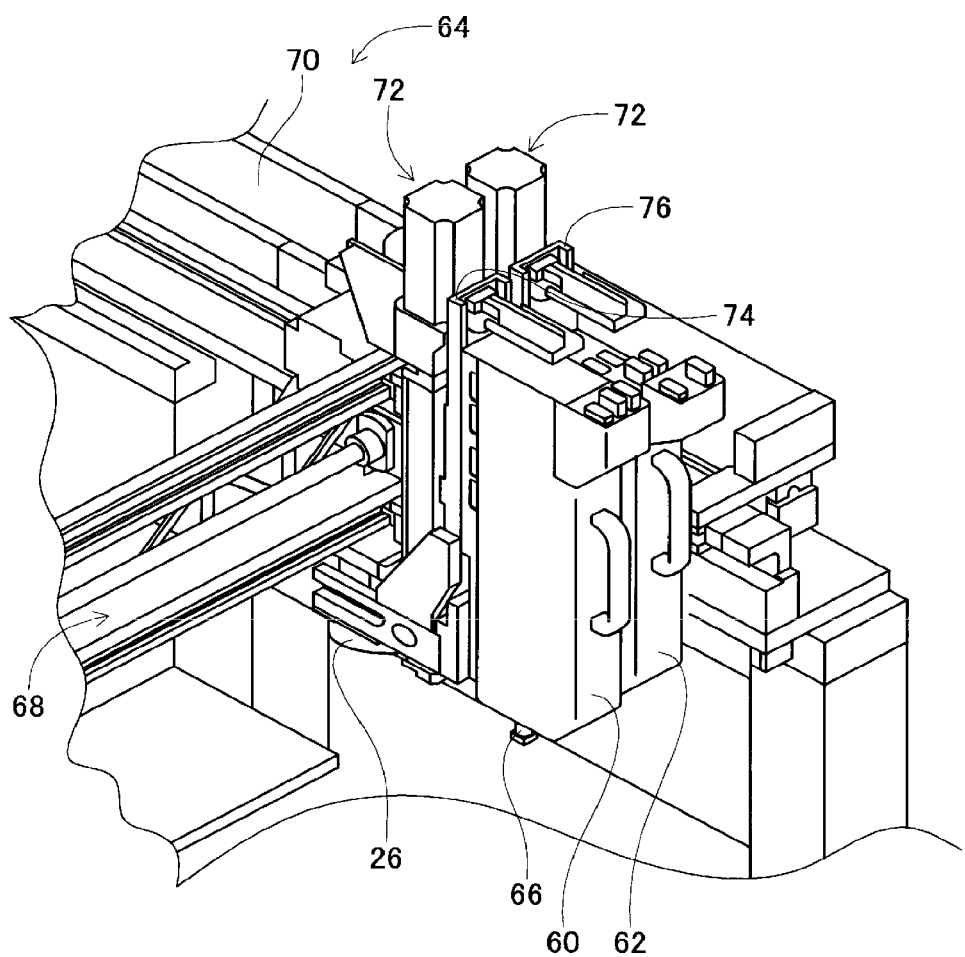
FIG. 2 is a perspective view of a component mounting device of the component mounter.

Component mounting device 24 is provided on beam section 42, and includes work heads 60 and 62 and work head moving device 64. Each work head 60 and 62 includes suction nozzle 66 (refer to FIG. 2) and holds a component using suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. By this, imaging device 28 images a component held by suction nozzle 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
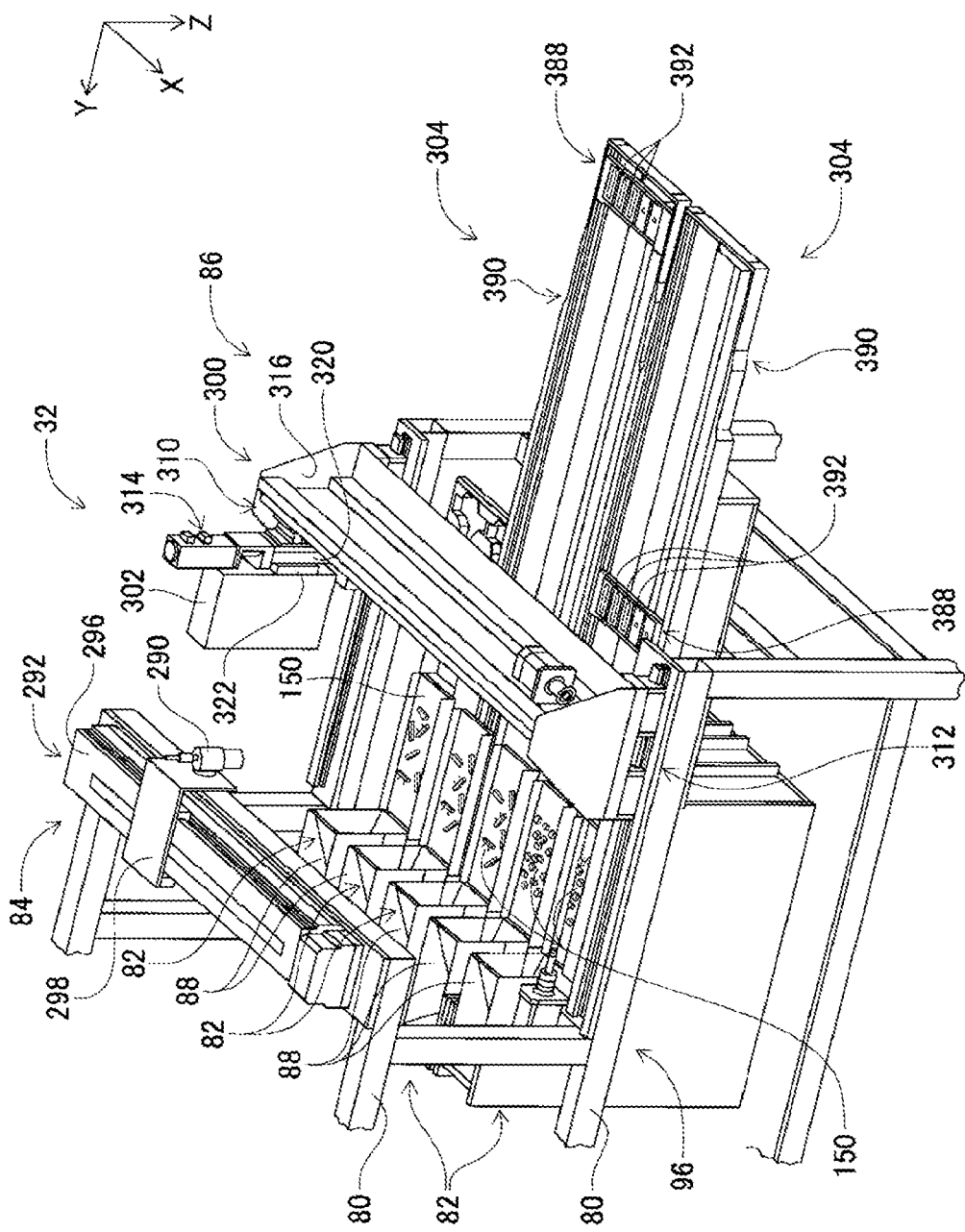
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90 (refer to FIG. 4), and component returning device 92 (refer to FIG. 5), with component supply apparatus 88, component scattering device 90, and component returning device 92 being integrated into one unit.

Component supply unit 82 is assembled to be removable from base 96 of main body 80, and with loose component supply device 32, five component supply units 82 are arranged in one row in the X direction.

(i) Component Supply Apparatus

Figure 4:
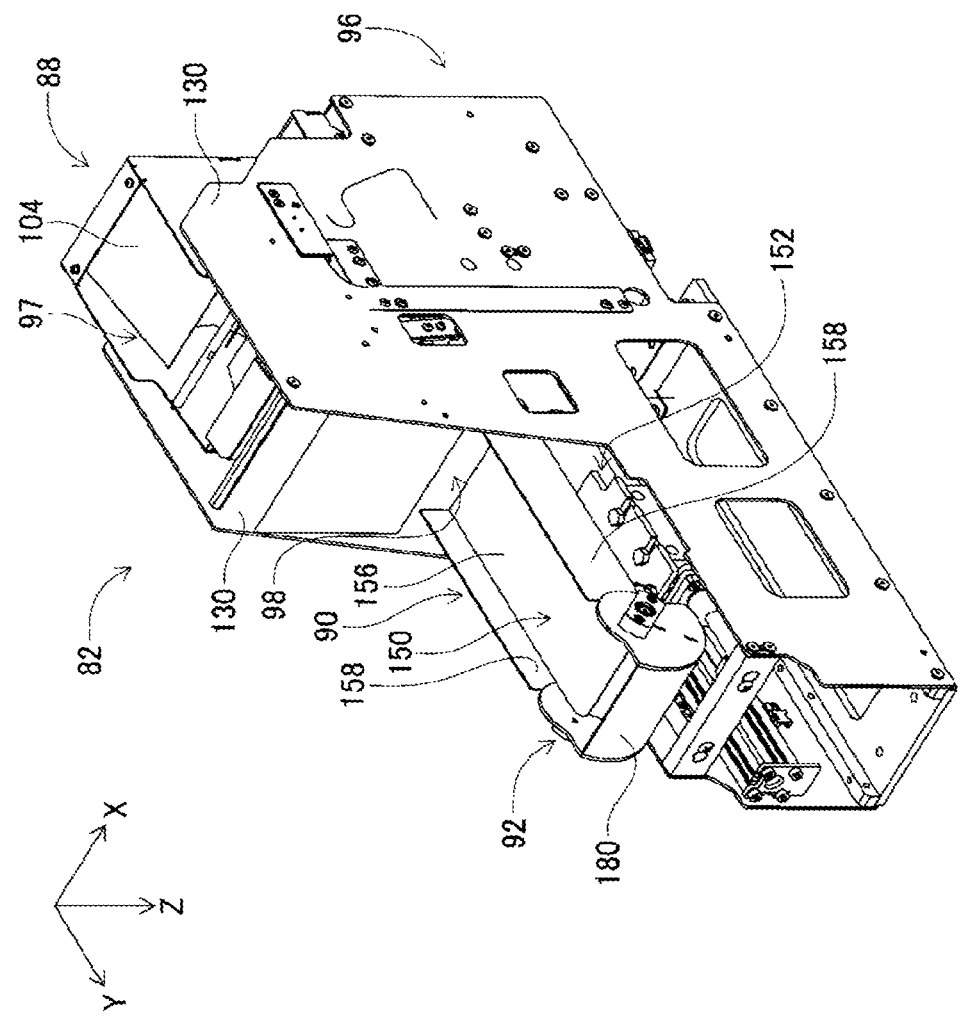
FIG. 4 is a perspective view of a component supply unit.
Figure 5:
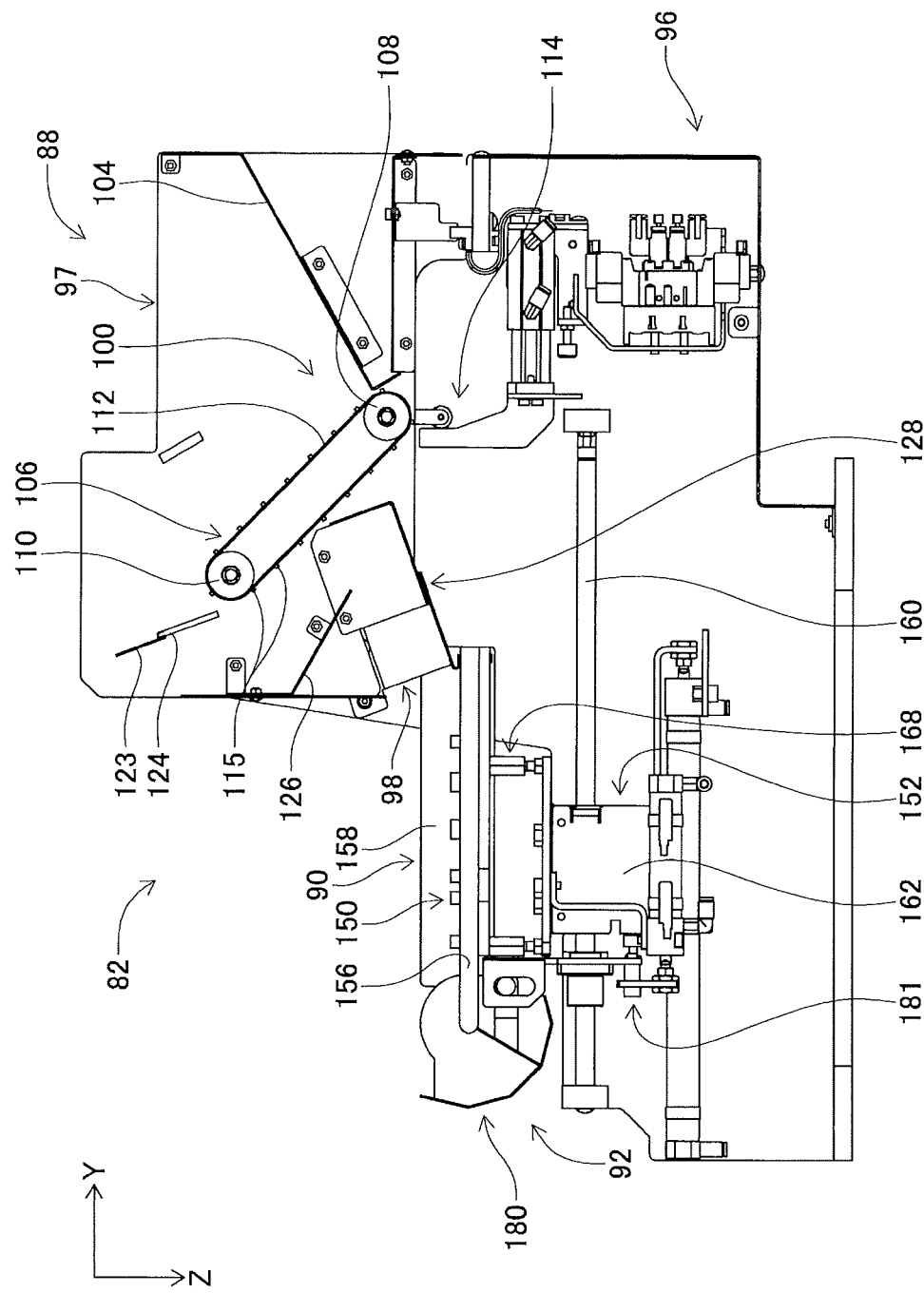
FIG. 5 is a cross section view of the component supply unit.

As shown in FIGS. 4 and 5, component supply apparatus 88 is a substantially cuboid box arranged to extend in the Y direction. The Y direction is the front-rear direction of component supply apparatus 88 with the left side in FIG. 5 sometimes referred to as the front and the right side in FIG. 5 sometimes referred to as the rear. That is, in component supply unit 82, the side towards the end at which component returning device 92 is arranged is sometimes referred to as the front, and the side towards the end at which component supply apparatus 88 is arranged is sometimes referred to as the rear.

Component supply apparatus 88 has openings at the upper surface and front surface; the opening at the upper surface is component insertion opening 97 and the opening at the front surface is component discharge opening 98. With component supply apparatus 88, inclined plate 104 is provided below insertion opening 97. Inclined plate 104 is arranged across the entire width (X direction) of component supply apparatus 88 and is inclined from the rear end surface of component supply apparatus 88 towards the center such that the front end of inclined plate 104 is positioned lower than the rear end.

Also, as shown in FIG. 5, conveyor device 106 is arranged at the front side of inclined plate 104. Conveyor device 106 includes a pair of rollers 108 and 110, and conveyor belt 112. Each of the rollers 108 and 110 are arranged inside component supply apparatus 88 extending in the width direction of component supply apparatus 88 across the entire width of component supply apparatus 88. Further, roller 108 faces the front end of inclined plate 104, that is, the lowest end of inclined plate 104, with a clearance gap between them. Note that, the clearance between the front end of inclined plate 104 and roller 108 is smaller than components that are supplied by component supply apparatus 88. Also, roller 110 is arranged diagonally above and to the front of roller 108. Conveyor belt 112 is stretched over the pair of rollers 108 and 110. Note that, conveyor belt 112 has a width slightly less than the internal width dimension of component supply apparatus 88.

Also, the pair of rollers 108 and 110 are rotatable around their center axis, with rotation being controlled by operation of rotation device 114. The rotation direction of rollers 108 and 110 is the counterclockwise direction in FIG. 5. Thus, conveyor belt 112 revolves around rollers 108 and 110 in a counterclockwise direction in FIG. 5. In other words, the conveyance direction of conveyor belt 112 is diagonally up from the front end of inclined plate 104. Multiple protrusions 115 are formed in the upper surface, that is, the conveyance surface, of conveyor belt 112 extending across the width of conveyor belt 112. The multiple protrusions 115 are formed at specified intervals in the revolving direction of conveyor belt 112 with the intervals being longer than the length direction of components supplied by component supply apparatus 88.

Also, brush holding section 123 is arranged diagonally above and in front of roller 110 of conveyor device 106. Brush holding section 123 is arranged extending in the width direction of component supply apparatus 88 across the entire width of component supply apparatus 88. Brush 124 is attached to the lower end of brush holding section 123 extending towards roller 110 of conveyor device 106. The width dimension of brush 124 is slightly smaller than the internal width dimension of component supply apparatus 88 and faces conveyor belt 112 wound around roller 110 across the entire width direction of component supply apparatus 88 with a clearance gap between brush 124 and conveyor belt 112. The clearance between the tip of brush 124 and conveyor belt 112 wound around roller 110 is longer than the thickness dimension of components supplied by component supply apparatus 88 and less than two times the thickness dimension of components supplied by component supply apparatus 88.

Also, inclined plate 126 is arranged diagonally below and in front of roller 110 of conveyor device 106. Inclined plate 126 is arranged across the entire width of component supply apparatus 88 and is inclined from the front end surface of component supply apparatus 88 to below roller 110 such that the rear end of inclined plate 126 is positioned lower than the front end. Further, inclined plate 128 is arranged below inclined plate 126. Inclined plate 128 is arranged across the entire width of component supply apparatus 88 and is inclined from below a central portion of conveyor device 106 towards discharge opening 98 of component supply apparatus 88 such that the front end of inclined plate 128 is positioned lower than the rear end. The rear end of inclined plate 128 is positioned further to the rear than the rear end of inclined plate 126, and the rear end of inclined plate 128 is bent upward at a right angle. The front end of inclined plate 128 is bent to the rear to be substantially horizontal.

As shown in FIG. 4, pair of side frame sections 130 are assembled on base 96. The pair of side frame sections 130 are parallel to each other and are arranged upright extending in the Y direction. The distance between the pair of side frame sections 130 is slightly larger than the width dimension of component supply apparatus 88, with component supply apparatus 88 being detachably mounted between the pair of side frame sections 130. As shown in FIG. 1, safety door 136 that can be opened and closed is provided on component supply device 32, and by opening safety door 136, the inside of component supply device 32 is exposed. Accordingly, by opening safety door 136, an operator can attach and remove component supply apparatus 88 between the pair of side frame sections 130.

(ii) Component Scattering Device

Component scattering device 90 includes component support member 150 and component support member moving device 152. Component support member 150 is configured from stage 156 and pair of side walls 158. Stage 156 is a substantially rectangular plate and is arranged extending forwards from below component supply apparatus 88 mounted between pair of side frame sections 130. Note that, the upper surface of stage 156 is substantially horizontal and, as shown in FIG. 5, is arranged with a small clearance gap from the bent front end of inclined plate 128 of component supply apparatus 88. Also, as shown in FIG. 4, pair of side walls 158 is fixed upright at both ends of stage 156 in the lengthwise direction, with the upper end of each side wall 158 extending above the upper surface of stage 156.

Further, as shown in FIG. 5, component support section moving device 152 includes guide rail 160 and slider 162. Guide rail 160 extends in the lengthwise direction of stage 156 below component support member 150. Slider 162 is slidably attached to guide rail 160 so as to be slid to any position by operation of electromagnetic motor 166 (refer to FIG. 11). Stage 156 of component support member 150 is connected to slider 162 via connection mechanism 168. Thus, component support member 150 moves in the Y direction by operation of component support member moving device 152, so as to move to and from a stored state (refer to FIG. 6) stored below component supply apparatus 88 and an exposed state (refer to FIG. 5) drawn out from below component supply apparatus 88.

(iii) Component Returning Device

Figure 7:
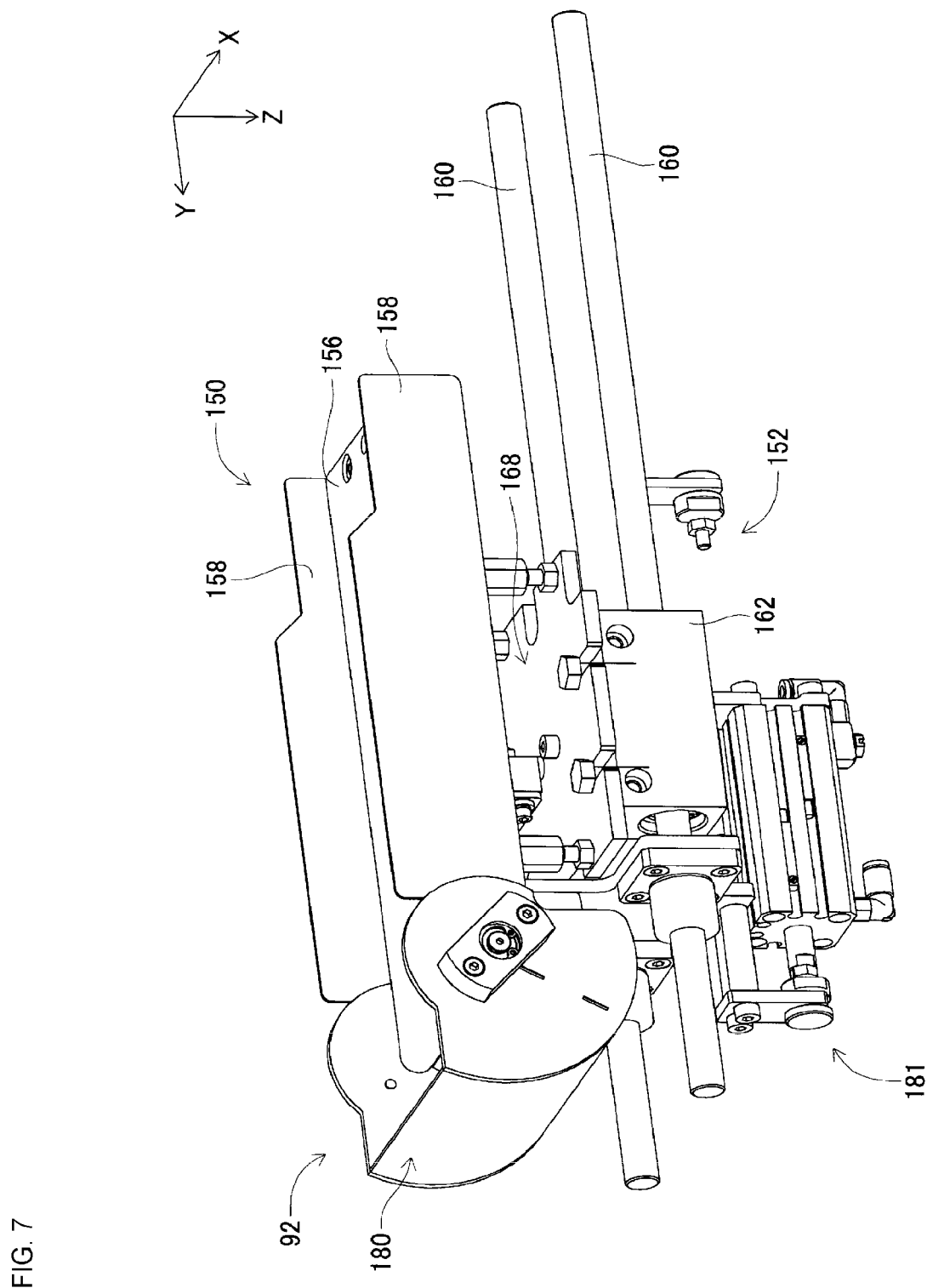
FIG. 7 is a perspective view of a component scattering device.
Figure 8:
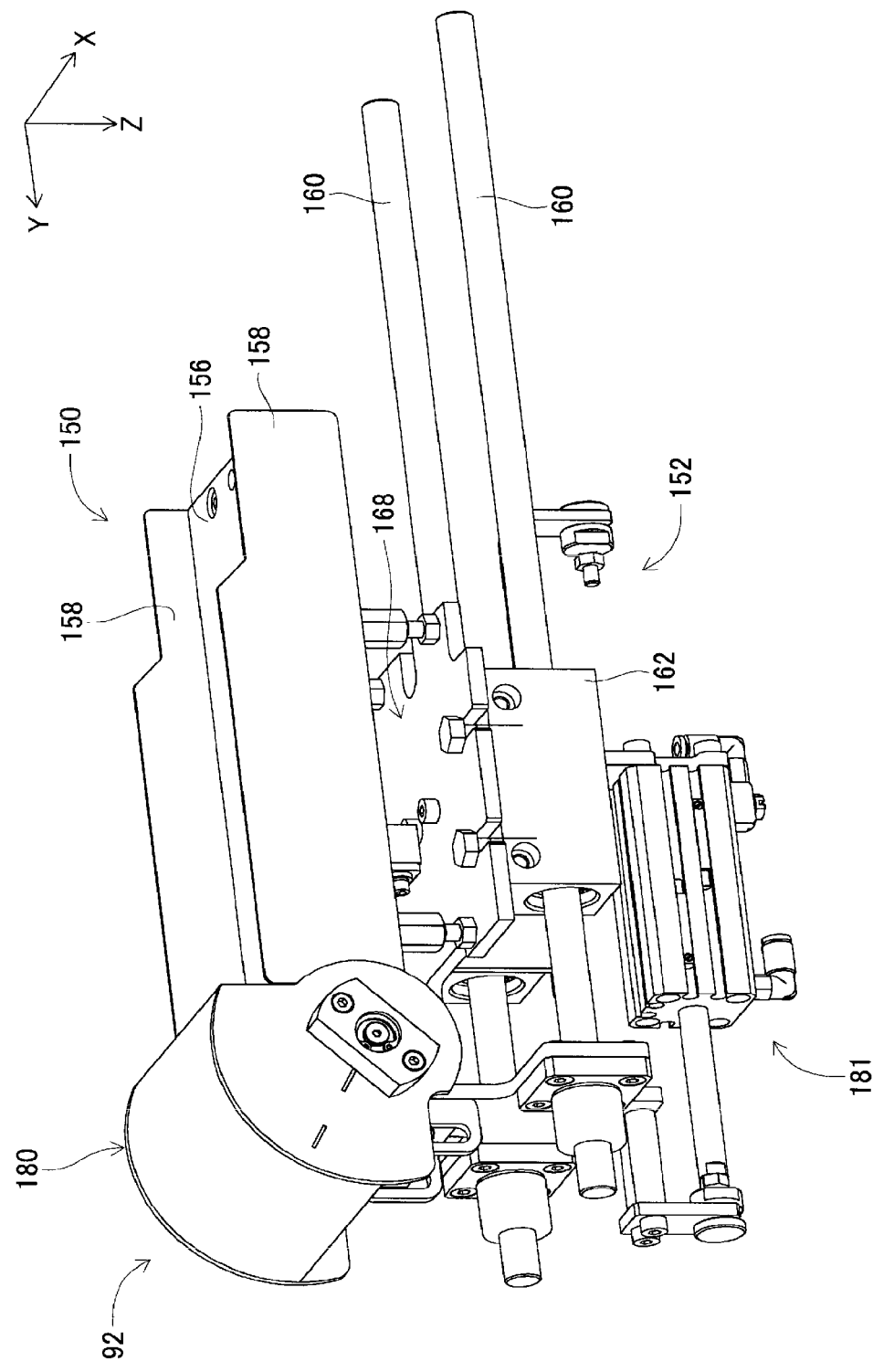
FIG. 8 is a perspective view of a component scattering device.

As shown in FIG. 7, component returning device 92 includes component collection container 180 and container oscillating device 181. Component collection container 180 is a box with an arc-shaped bottom surface. Component collection container 180 is held to be swingable around the front end of stage 156 of component holding member 150 and is swung by operation of container oscillating device 181. Here, component collection container 180 is swung between a collection orientation (refer to FIG. 7) with the opening facing up, and a return orientation (refer to FIG. 8) with the opening facing the upper surface of stage 156 of component support member 150.

(b) Imaging Device

As shown in FIG. 3, imaging device 84 includes camera 290 and camera moving device 292. Camera moving device 292 includes guide rail 296 and slider 298. Guide rail 296 is fixed to main body 80 above component supply apparatus 88 so as to extend in the width direction (X direction) of loose component supply device 32. Slider 298 is slidably attached to guide rail 296, and can be slid to any position by operation of electromagnetic motor 299 (refer to FIG. 11). Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 and extending in the X direction, and Y slider 316 is moved to any position in the Y direction by operation of electromagnetic motor 319 (refer to FIG. 11). X-direction moving device 310 includes X slider 320 provided on a side surface of Y slider 316, and X slider 320 is moved to any position in the X direction by operation of electromagnetic motor 321 (refer to FIG. 11). Z-direction moving device 314 includes Z slider 322 provided on a side surface of X slider 320, and Z slider 322 is moved to any position in the Z direction by operation of electromagnetic motor 323 (refer to FIG. 11).

Figure 9:
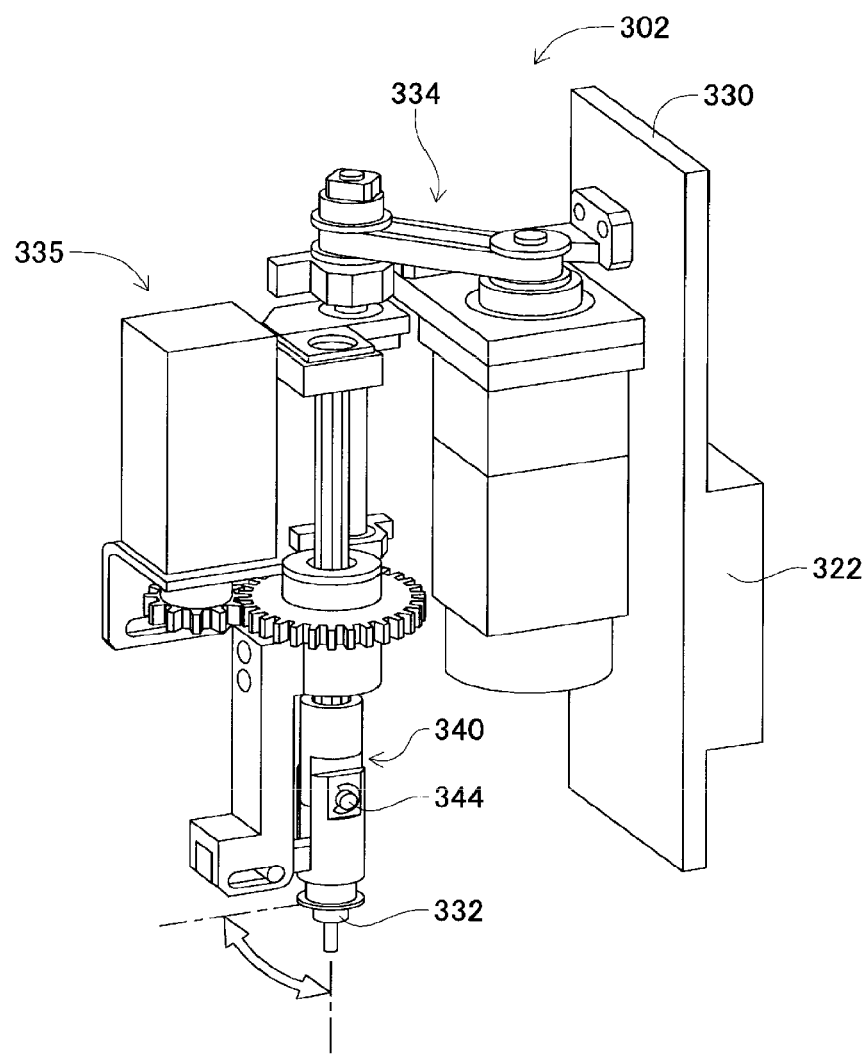
FIG. 9 is a perspective view of a component holding head.

As shown in FIG. 9, component holding head 302 includes head main body 330, suction nozzle 332, nozzle pivoting device 334, and nozzle rotating device 335.

Head main body 330 is formed as one body with Z slider 322. Suction nozzle 332 is for holding a component, and is detachably attached to a lower end section of holder 340. Holder 340 is able to bend at support shaft 344, and holder 340 bends 90 degrees in an up direction by operation of nozzle pivoting device 334. By this, suction nozzle 332 attached to the bottom end of holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 335 rotates suction nozzle 332 around its own center axis.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 10:
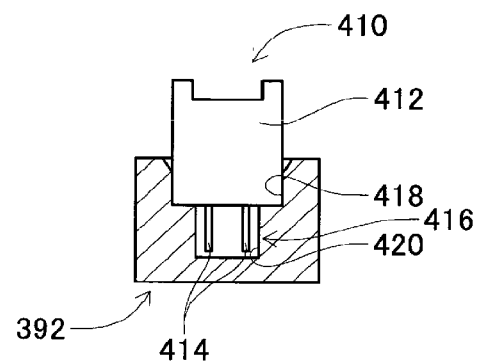
FIG. 10 shows a component receiving member in which is stored a leaded component.

In detail, as shown in FIG. 10, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392 in accordance with the shape of leaded component 410. Component reception recess 416 is a stepped recess configured from main body section reception recess 418 open at the top surface of component receiving member 392, and lead reception recess 420 open at the bottom surface of main body section reception recess 418. Main body section reception recess 418 is formed in accordance with the shape of main body section 412 of leaded component 410, and lead reception recess 420 is formed in accordance with the shape of leads 414 of leaded component 410. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 and extending in the front-rear direction. Component carrier 388 is provided on the upper surface of component carrier moving device 390 to be slidable in the front-rear direction, and is slid to any position in the front-rear direction by operation of electromagnetic motor 430 (refer to FIG. 11). Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 11:
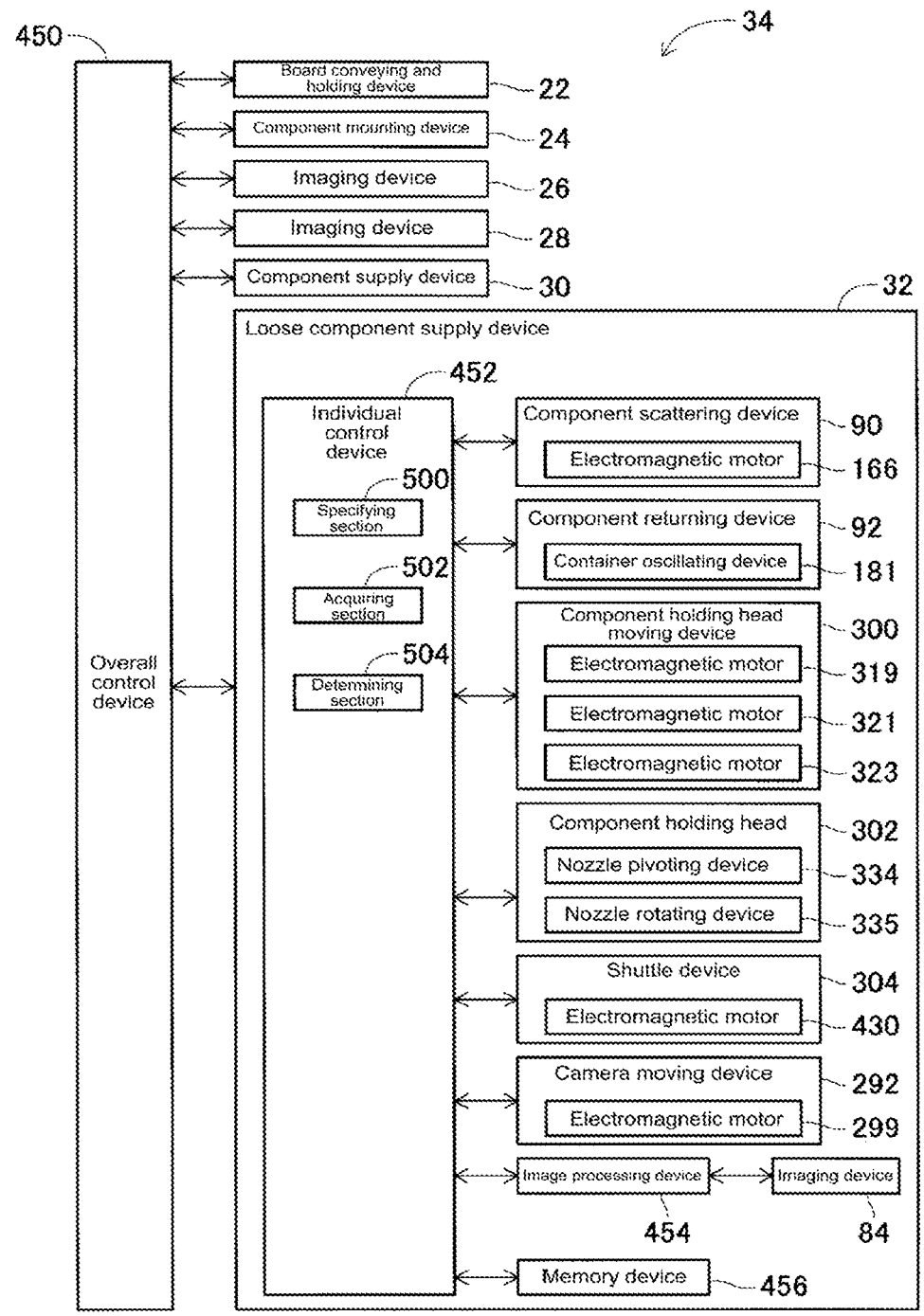
FIG. 11 is a block diagram showing a control device of the component mounter.

Further, as shown in FIG. 11, control device 34 includes overall control device 450, multiple individual control devices (only one is shown in the FIG. 452, image processing device 454, and memory device 456. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84. Also, memory device 456 memorizes various types of data and is connected to individual control device 452. By this, individual control device 452 acquires various types of data from memory device 456.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using suction nozzle 66. Then, work head 60 or 62 holding the component moves above imaging device 28, and the component being held by suction nozzle 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Loose Component Supply Device Operation (a) Supply of Leaded Components Using Loose Component Supply Device With loose component supply device 32, leaded components 410 are inserted by an operator into insertion opening 97 of component supply apparatus 88, then the inserted leaded components 410 are supplied in a state loaded on component receiving member 392 of component carrier 388 by operation of component supply unit 82 and component transfer device 86. In detail, the operator inserts leaded components 410 via insertion opening 97 at the top of component supply apparatus 88. Here, component supporting member 150 is moved below component supply apparatus 88 by operation of component support member moving device 152 to be in a stored state (refer to FIG. 6). With component support member 150 in a stored state, component collection container 180 positioned at the front end of component support member 150 is positioned in front of component supply apparatus 88, and the opening of component collection container 180 is oriented facing up (collection orientation).

Figure 6:
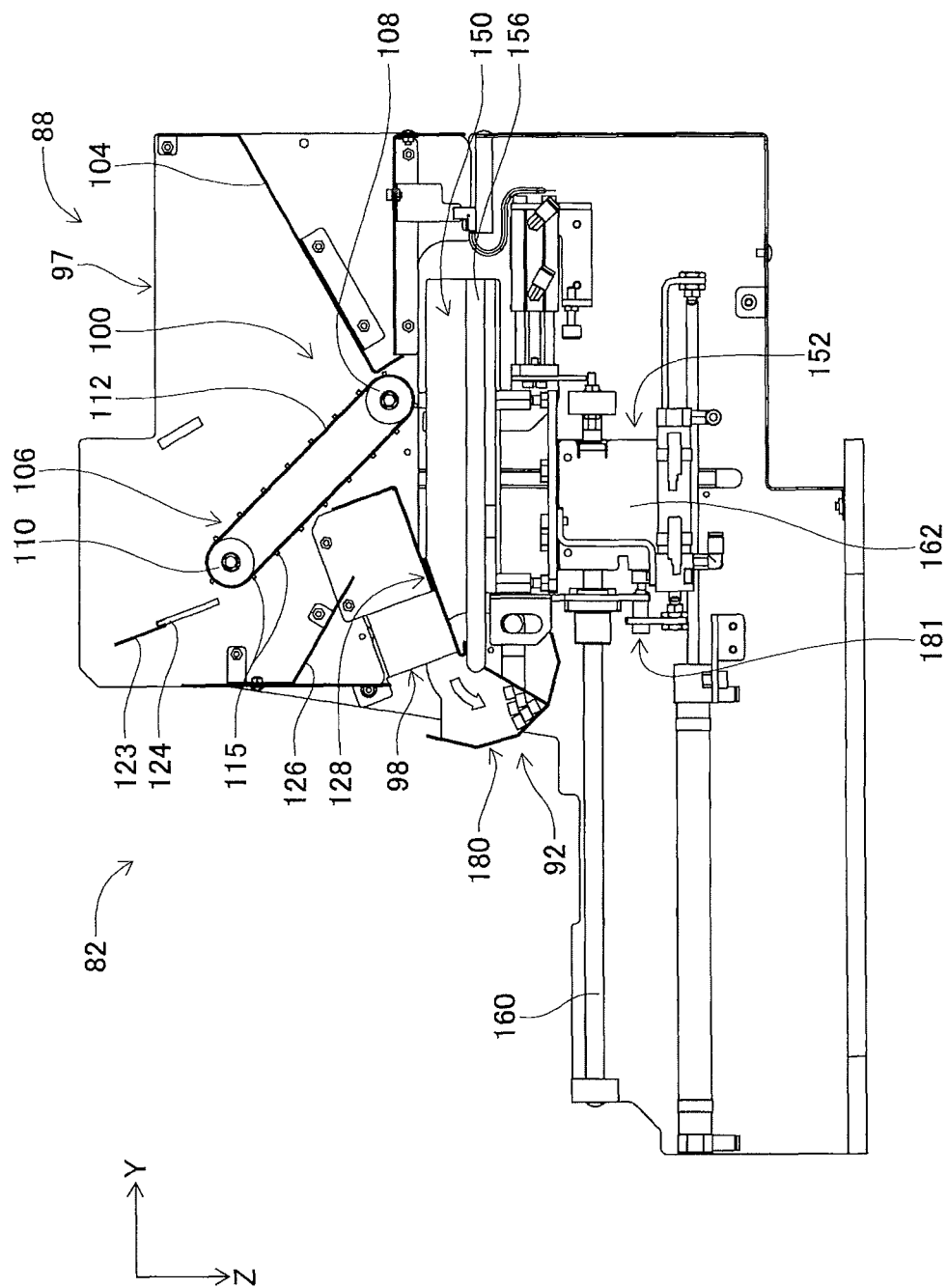
FIG. 6 is a cross section view of the component supply unit.

Leaded components 410 inserted via insertion opening 97 on the top surface of component supply apparatus 88 fall onto inclined plate 104 of component supply apparatus 88 and roll down to the front lower end of inclined plate 104. Here, leaded components 410 that have rolled down to the front bottom end of inclined plate 104 pile up between the front bottom end of inclined plate 104 and the rear bottom end of conveyor device 106. In other words, between the lower front end of inclined plate 104 and the lower rear end of conveyor device 106 functions as housing section 100 for housing leaded components 410. Then, when rotation device 116 of conveyor device 106 is operated, conveyor belt 112 of conveyor device 106 is rotated counterclockwise as shown in FIG. 6. By this, leaded components 410 piled up in housing section 100 are conveyed by conveyor belt 112 diagonally up and forward.

Then, leaded components 410 conveyed diagonally up by conveyor belt 112 pass between the upper end on the front side of conveyance device 106 and brush 124 and fall onto inclined plate 120 provided below the upper end on the front side of conveyance device 106 and brush 124. Leaded components 410 that have fallen onto inclined plate 126 roll towards the rear of inclined plate 126 onto inclined plate 128 provided below inclined plate 126. Then, leaded components 410 that have fallen onto inclined plate 128 roll towards the front and are discharged from discharge opening 98 at the front of component supply apparatus 88. In this manner, leaded components 410 that have fallen from the front end of conveyor device 106 fall onto inclined plate 126 and then onto inclined plate 128. That is, leaded components 410 are discharged from discharge opening 98 of component supply apparatus 88. By this, damage to leaded components 410 due to falling is reduced.

Component support member 150 is moved towards the front from under component supply apparatus 88 due to operation of component supply member moving device 152 at the time that leaded components 410 are discharged from discharge opening 98 of component supply apparatus 88. By this, leaded components 410 discharged from discharge opening 98 of component supply apparatus 88 are discharged onto the upper surface of stage 156 of component support member 150.

Leaded components 410 that have been discharged onto stage 156 from component supply apparatus 88 roll forward, though even if they roll and fall from the front of stage 156 they are stored in component collection container 180. Also, if leaded components 410 that have been discharged onto stage 156 from component supply apparatus 88 roll sideways, they are prevented from falling from stage 156 by side walls 158 of component support member 150.

Then, component support member 150 is moved forwards from the stored state to the exposed state and then movement of component support member 150 is stopped. By this, leaded components 410 are scattered across the entire upper surface of stage 156. With component supply apparatus 88, operation of conveyor device 106 is stopped to match the timing of the stopping of the operation of component support member 150 such that leaded components 410 are discharged finally from component supply apparatus 88.

According to the above procedure, when leaded components 410 are scattered from component supply apparatus 88 onto stage 156 of component support member 150, camera 290 of imaging device 84, by operation of camera moving device 292, moves above component support member 150 and images leaded components 410. Then, leaded components 410 scattered on the upper surface of component support member 150, based on the imaging data, are divided into leaded components that can be picked up by suction nozzle 332 (also referred to as "pickup target components") and leaded components that cannot be picked up by suction nozzle 332 (also referred to as "non-pickup target components"). As it is not particularly relevant to the present disclosure, the method for dividing into pickup target components and non-pickup target components will be described only briefly: leaded components 410 with a surface, such as an uneven surface, that makes pickup difficult facing up, components with a lead 414 contacting the upper surface of component support member 150, tilted components, and the like are designated as non-pickup target components, and other leaded components 410 are designated as pickup target components. Based on the imaging data, information such as the position on component support member 150 and the orientation of leaded component 410 is obtained with regard to the leaded components 410 designated as pickup target components.

Then, based on the obtained position information of the pickup target components, component holding head 302 is moved above a pickup target component by operation of component holding head moving device 300 and the pickup target component is picked up using suction nozzle 332. Note that, when the pickup target component is picked up and held by suction nozzle 332, suction nozzle 332 is in the non-pivoted position.

Then, after holding leaded component 410 using suction nozzle 332, component holding head 302 is moved above component carrier 388. Then, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 335 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception recess 416 of component reception member 392. By this, as shown in FIG. 10, leaded component 410 is loaded in component receiving member 392 with leads 414 facing vertically downwards.

Also, when leaded component 410 is loaded on component receiving member 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with the upper surface that is opposite to the bottom surface to which leads 414 are connected facing upwards. Therefore, suction nozzle 66 of work head 60 or 62 is able to appropriately hold leaded component 410.

(b) Collection and Replenishment of Leaded Components

With loose component supply device 32, when pickup target components are scattered on stage 156 of component support member 150, pickup of the scattered pickup target components is repeated and the picked up pickup target components are loaded on component receiving member 392. Then, by component carrier 388 mounted on component receiving member 392 being moved to the component supply position, supply of leaded components 410 is performed. However, if there are no pickup target components scattered on stage 156 of component support member 150, that is, all the leaded components 410 that can be picked up have been picked up and only non-pickup target components remain on stage 156, it is no longer possible to pick up a leaded component 410 from stage 156.

Thus, with loose component supply device 32, in such a case, leaded components 410 remaining on stage 156 are collected in component collection container 180. Then, leaded components 410 collected into component collection container 180 are scattered again onto stage 156, and by doing so the orientation of the leaded components 410 changes such that pickup of leaded components 410 from stage 156 can be restarted.

In detail, component support member 150 is moved below component supply apparatus 88 by operation of component support member moving device 152. That is, component support member 150 is moved from the exposed state (refer to FIG. 5) towards the stored state (refer to FIG. 6). Here, component collection container 180 provided at the front end of component support member 150 is oriented such that the opening is facing up, that is, component support member 150 is in the collection orientation. Therefore, leaded components 410 on stage 156 of component support member 150 are stopped by the front end of inclined plate 128 of component supply apparatus 88 in accordance with the movement of component support member 150. Further, as shown in FIG. 6, when component support member 150 reaches the stored state, leaded components 410 on stage 156 fall inside component collection container 180.

Continuing, component support member 150 is moved from the stored state towards the front by the operation of component support member moving device 152. Also, when component support member 150 has been moved forward from the stored state by a specified amount, container swinging device 181 of component returning device 92 is operated and component collection container 180 is swung. Accordingly, the orientation of component collection container 180 is changed suddenly from an orientation with the opening of facing up (collection orientation) to an orientation with the opening facing stage 156 (returning orientation). In this case, leaded components 410 collected in component collection container 180 are discharged with strong force towards stage 156. Thus, by scattering leaded components 410 on stage 156 from component collection container 180, the orientation of the leaded components 410 is changed, and leaded components 410 are picked up again from stage 156.

Changing Type of Component to be Supplied by Loose Component Supply Device

As described above, with loose component supply device 32, leaded components 410 housed in component supply apparatus 88 are supplied in a state loaded on component receiving member 392 of component carrier 388. Further, by changing the type of leaded component 410 housed in component supply apparatus 88, the type of component supplied by loose component supply device 32 is changed. That is, an operator opens safety door 136, removes component supply apparatus 88 from loose component supply device 32, and changes the leaded components 410 housed in component supply apparatus 88 to a different type. Further, by attaching a component supply apparatus 88 that houses a different type of component to loose component supply device 32, it is possible to change the type of component supplied by the loose component supply device 32.

However, with loose component supply device 32, leaded components 410 housed in component supply apparatus 88 are supplied in a state loaded in component reception member 392 of component carrier 388, thus, when the type of component supplied by loose component supply device 32 is changed, the type of component reception member 392 attached to component carrier 388 is exchanged as well as the type of leaded component 410 housed in component supply apparatus 88 being exchanged.

Figure 12:
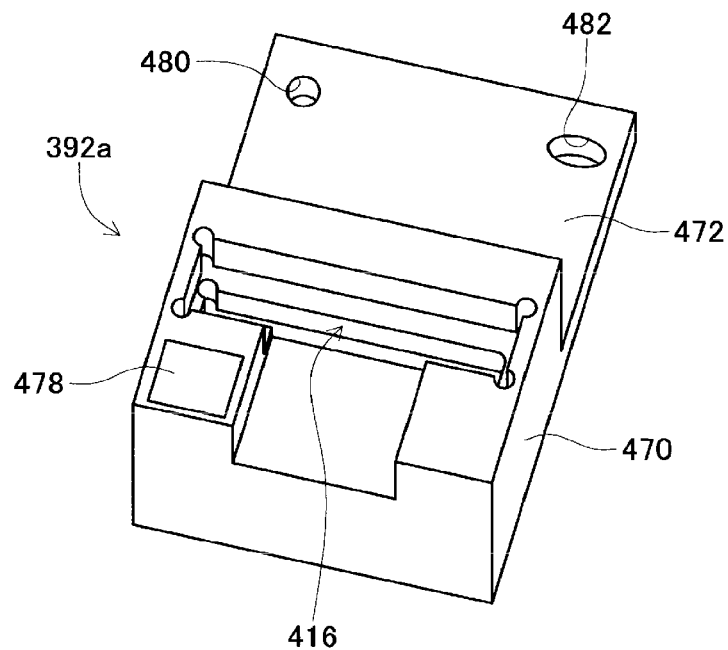
FIG. 12 is a perspective view showing component receiving member 392.
Figure 13:
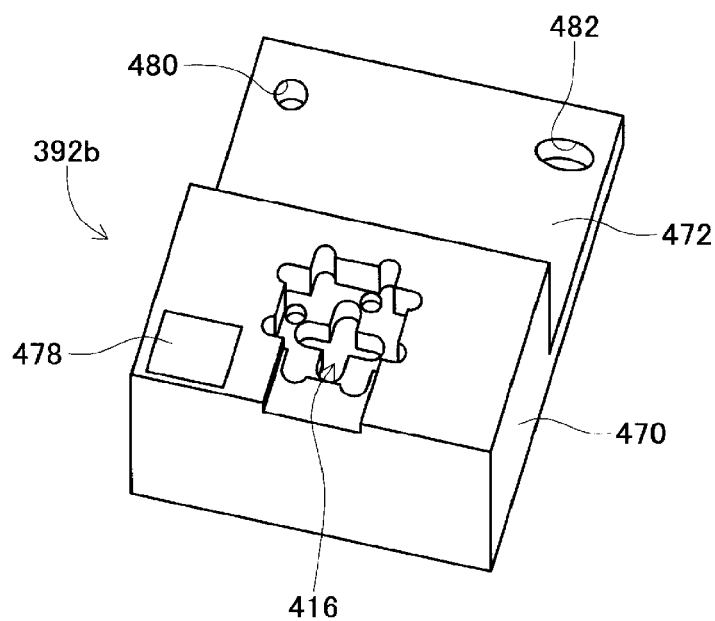
FIG. 13 is a perspective view showing component receiving member 392.
Figure 14:
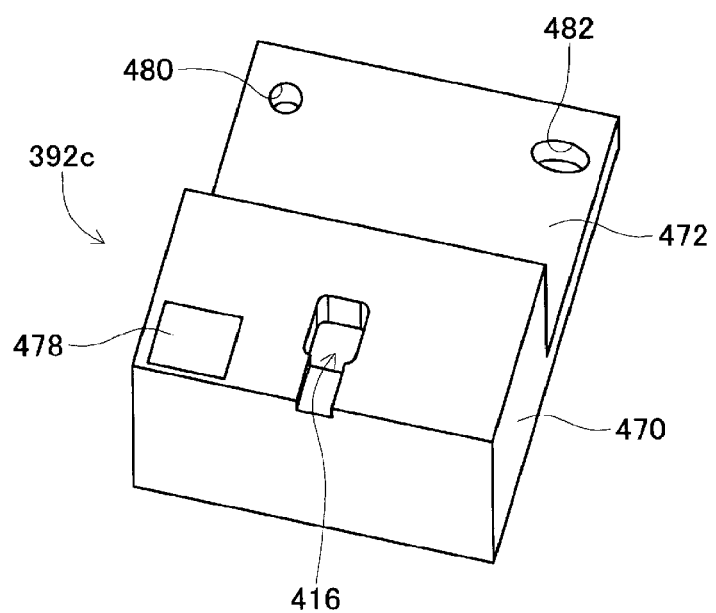
FIG. 14 is a perspective view showing component receiving member 392.

Specifically, as described above, component reception recess 416 is formed in component reception member 392 in accordance with the component that is loaded, and the component to be supplied is loaded in that component reception recess 416. Thus, as shown in FIGS. 12 to 14, in accordance with the type of component supplied by loose component supply device 32, multiple types of component reception members, 392a to 392c, are prepared.

Each component reception member 392a to 392c is configured from thick plate section 470 and thin plate section 472, with thick plate section 470 and thin plate section 472 being integrated as one item. Component reception recess 416 is formed in a central section on the upper surface of thick plate section 470 in accordance with the shape of the component scheduled to be loaded. Note that, component reception member 392a is for loading component A, so component reception recess 416 of component reception member 392a is formed in accordance with component A. Likewise, component reception member 392b is for loading component B, so component reception recess 416 of component reception member 392b is formed in accordance with component B. Further, component reception member 392c is for loading component C, so component reception recess 416 of component reception member 392c is formed in accordance with component C.

Identification plate 478 is attached at a corner of the upper surface of thick plate section 470. A 2D code (not shown) is provided on identification plate 478, the 2D code indicating the type of component to be loaded on component reception recess 416. Therefore, a 2D code for component A is provided on the identification plate 478 of component reception member 392a, a 2D code for component B is provided on the identification plate 478 of component reception member 392b, and a 2D code for component C is provided on the identification plate 478 of component reception member 392c.

Also, a pair of through-holes 480 and 482 that pierce in a vertical direction are formed in thin plate section 472 of each of component reception members 392a to 392c. These pair of through-holes 480 and 482 are formed at the same positions in each of component reception members 392a to 392c, and a pair of pins (not shown) that are inserted into the pair of through-holes 480 and 482 are provided on component carrier 388. Thus, by inserting the pins of component carrier 388 into through-holes 480 and 482 of component reception member 392a to 392c, the component reception member 392a to 392c is attached to component carrier 388 at a specified position.

According to such a configuration, when the type of component supplied by loose component supply device 32 is changed, by an operator lifting up a component reception member 392a to 392c attached to component carrier 388, pins are removed from through-holes 480 and 482, and component reception member 392a to 392c attached to component carrier 388 is removed. Also, from the multiple component reception members 392a to 392c, the component reception member 392a to 392c that is in accordance with the component scheduled to be supplied by loose component supply device 32, that is, the component reception member 392a to 392c in accordance with the component housed in component supply apparatus 88, is selected. Further, by an operator lowering the selected component reception member 392a to 392c onto component carrier 388, the pins of component carrier 388 are inserted into through-holes 480 and 482 of component reception member 392a to 392c. Thus, the selected component reception member 392a to 392c is attached to component carrier 388 at the specified position.

In this manner, by exchanging the component reception member 392a to 392c attached to component carrier 388 in accordance with the component scheduled to be supplied as well as exchanging the component housed in component supply apparatus 88 to the component scheduled to be supplied, it is possible to change the type of component supplied by loose component supply device 32. However, there are cases in which an operator forgets to exchange component reception member 392a to 392c even though the component housed in component supply apparatus 88 has been exchanged. Also, there are cases in which an operator mistakenly exchanges a component reception member 392a to 392c attached to component carrier 388 with an item in accordance with a component different to the component scheduled to be supplied even though it is necessary to exchange it with an item in accordance with the component scheduled to be supplied. In this manner, in a case in which a component reception member 392a to 392c in accordance with the component scheduled to be supplied is not attached to component carrier 388 due to human error, the component cannot be appropriately loaded on the component reception member 392a to 392c, and appropriate component supply cannot be performed.

Specifically, there may be a case in which an operator mistakenly attaches component reception member 392c to component carrier 388 even though the component scheduled to be supplied is component A. As shown in FIG. 12, component reception recess 416 of component reception member 392a for component A is relatively large, due to the fact that component A is relatively large. On the other hand, as shown in FIG. 14, component reception recess 416 of component reception member 392c is relatively small. Therefore, if component reception member 392c is attached to component carrier 388 even though the component scheduled to be supplied is component A, component A cannot be loaded in component reception recess 416 of component reception member 392c and component A cannot be supplied.

Considering this, with loose component supply device 32, identification plate 478 of the component reception member 392a to 392c attached to component carrier 388 is imaged using camera 290 of imaging device 84, and based on the imaging data, it is determined whether the component reception member 392a to 392c attached to component carrier 388 is in accordance with the component scheduled to be supplied. In detail, camera 290 is moved above component carrier 388 by operation of camera moving device 292. Then, identification plate 478 of component reception member 392a to 392c attached to component carrier 388 is imaged by camera 290, and imaging data of identification plate 478 obtained by the imaging is sent to individual control device 452. The sent imaging data is analyzed in individual control device 452 and the 2D code provided on identification plate 478 is identified.

Further, on memory device 456, for each of the multiple component reception members 392a to 392c, a link is memorized between the 2D code provided on the identification plate 478 of each component reception member 392a to 392c and the type of component that is able to be loaded in the component reception recess 416 of each component reception member 392a to 392c. Therefore, individual control device 452 references the information memorized on memory device 456 and identifies the type of component (also referred to as "component type corresponding to 2D code") linked to the 2D code that was identified based on the imaging data.

Also, a program for performing component supply work by loose component supply device 32 is memorized on memory device 456. Items such as the type of the component scheduled to be supplied, the supply quantity, and the supply timing are programmed in this program. Thus, individual control device 452, based on the program memorized in memory device 456, identifies the type of component scheduled to be supplied (also referred to as "component type scheduled to be supplied") by loose component supply device 32. Then, individual control device 452 determines whether the component type corresponding to the 2D code is the same as the component type scheduled to be supplied. Here, if the component type corresponding to the 2D code is the same as the component type scheduled to be supplied, component supply work is performed by loose component supply device 32. On the other hand, if the component type corresponding to the 2D code is not the same as the component type scheduled to be supplied, component supply work is not performed by loose component supply device 32 and the fact that the component type corresponding to the 2D code is not the same as the component type scheduled to be supplied is displayed on a display device (not shown). Thus, an operator recognizes that a component reception member 392a to 392c in accordance with a component that is different to the component scheduled to be supplied is attached to component carrier 388, and the operator exchanges the component reception member 392a to 392c attached to component carrier 388 for a component reception member in accordance with the component scheduled to be supplied.

Note that, work of recognizing the component reception member 392a to 392c based on imaging data of identification plate 478 is performed each time safety door 136 of loose component supply device 32 is opened and closed. This is because, in a case in which safety door 136 is opened and closed, there is a high chance that exchange of the component housed in component supply apparatus 88 or exchange of the component reception member 392a to 392c attached to component carrier 388 has been performed.

In this manner, it is determined automatically by individual control device 452 whether the component type corresponding to the 2D code and the component type scheduled to be supplied are the same, and in a case in which the component type corresponding to the 2D code and the component type scheduled to be supplied are not the same, by displaying that fact on a display device, the occurrence of human errors such as attaching the wrong component reception member 392a to 392c is avoided. Thus, it is possible to reliably attach a component reception member 392a to 392c in accordance with the component scheduled to be supplied to component carrier 38, and appropriate component supply by loose component supply device 32 is guaranteed.

Also, as shown in FIG. 11, individual control device 452 includes specifying section 500, acquiring section 502, and determining section 504. Specifying section 500 is a functional section for identifying the component type corresponding to the 2D code. Acquiring section 502 is a functional section for acquiring the component type scheduled to be supplied. Determining section 504 is a functional section for determining whether the component type corresponding to the 2D code and the component type scheduled to be supplied are the same.

Note that, loose component supply device 32 is an example of a component supply system. Imaging device 84 is an example of an imaging device. Stage 156 is an example of a stage. Suction nozzle 332 is an example of a holding tool. Component carrier 388 is an example of a setting section. Component reception member 392 is an example of a loading platform. Individual control device 452 is an example of a control device. Memory device 456 is an example of a memory device. Identification plate 478 is an example of an identification section. Specifying section 500 is an example of a specifying section. Acquiring section 502 is an example of an acquiring section. Determining section 504 is an example of a determining section.

Further, the present disclosure is not limited to the above example embodiments, and various changed or improved methods of embodiment are possible based on the knowledge of someone skilled in the art. Specifically, for example, in an embodiment above, identification plate 478 is imaged, and based on the imaging data, the component type corresponding to the 2D code is identified, but identification plate 478 may be read by a barcode reader or the like so as to identify the component type corresponding to the 2D code.

Further, in an embodiment above, a 2D code is used as an identification section, but various identification symbols such as QR codes (registered trademark) may be used. Also, this is not restricted to identification symbols, various types of identification sections may be used, so long as identification of the component type is possible. Specifically, for example, an RFID (radio frequency identifier) may be used as an identification section, and the component type may be identified by receiving ID information included in the RFID. Also, for example, multiple holes may be formed in component reception member 392, and the component type may be identified based on the arrangement of the multiple holes.

Further, in an embodiment above, individual control device 452 acquires the component type scheduled to be supplied based on a program, but the component type scheduled to be supplied may be acquired by various methods. Specifically, for example, the component type scheduled to be supplied may be acquired based on information entered via an input device. Further, for example, the component type scheduled to be supplied may be acquired based on imaging data of components scattered on stage 156.

Also, in embodiments above, the present disclosure is applied to leaded components, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device);
84: imaging device;
156: stage;
332: suction nozzle (holding tool);
388: component carrier (setting section);
392: component reception member (loading platform);
452: individual control device (control device);
456: memory device;
478: identification plate (identification section);
500: specifying section;
502: acquiring section;
504: determining section

The invention claimed is:

1. A component supply system comprising:
   a component supplier detachably attached to the component supply system and configured to perform component supply work that supplies components;
   a safety door that when opened allows access to the component supplier for removal and installation;
   a stage configured to support the components supplied by the component supplier;
   a holding tool configured to hold a component of the components scattered on the stage;
   a component carrier to hold a loading platform which includes a recess to receive the component, the component held by the holding tool is loaded in the recess of the loading platform, and the loading platform includes an identification plate identifying a type of component to be loaded in the recess by the holding tool;
   a camera to image the identification plate of the loading platform loaded on the component carrier;
   a memory configured to memorize and link information related to the identification plate and the type of the component to be loaded in the recess and to memorize a schedule of a type of the component to be supplied to the stage by the component supplier; and
   a control device configured to execute component change work each time the safety door is opened, the component change work including
      identifying the type of the component to be loaded in the recess based on image data of the identification plate obtained by the camera,
      acquiring from the memory the type of the component to be supplied to the stage,
      determining whether the type of the component to be supplied to the stage acquired from the memory and the type of the component to be loaded in the recess identified by the camera are the same,
      when the type of the component to be supplied to the stage acquired from the memory and the type of the component to be loaded in the recess identified by the camera are the same, instructing the component supplier to perform the component supply work, and
      when the type of the component to be supplied to the stage acquired from the memory and the type of the component to be loaded in the recess identified by the camera differ, instructing the component supplier to not perform the component supply work.

2. The component supply system according to claim 1, wherein
   the control device calculates information related to the identification plate based on the image data of the identification plate, and specifies the type of the component memorized in the memory linked to the calculated information related to the identification plate.

3. The component supply system according to claim 1, wherein
   the recess includes a plurality of shape types that correspond to the type of component.

4. The component supply system according to claim 1, wherein
   the identification plate is on an upper surface of the loading platform.

5. The component supply system according to claim 1, wherein the loading platform includes a pair of through-holes configured to receive pins of the component carrier.

6. The component supply system according to claim 5, wherein the loading platform is detachably attached to the component carrier by the pair of through-holes.

7. The component supply system according to claim 1, wherein the component carrier includes multiple of the loading platform.

8. The component supply system according to claim 1, wherein the camera is configured to image the components on the stage and a pick-up target component is determined based on an image of the components.

* * * * *